United States Patent [19]

Houston

[11] Patent Number: 5,521,524
[45] Date of Patent: May 28, 1996

[54] METHOD AND SYSTEM FOR SCREENING RELIABILITY OF SEMICONDUCTOR CIRCUITS

[75] Inventor: Theodore W. Houston, Richardson, Tex.

[73] Assignee: Texas Instruments Incorporated, Dallas, Tex.

[21] Appl. No.: 224,226

[22] Filed: Apr. 7, 1994

Related U.S. Application Data

[62] Division of Ser. No. 909,874, Jul. 7, 1992, Pat. No. 5,325,054.

[51] Int. Cl.⁶ .................................... G01R 31/28
[52] U.S. Cl. .................. 324/765; 324/158.1; 324/769
[58] Field of Search .................. 324/765, 768, 324/769, 158.1, 767; 371/21.1, 21.4, 25.1, 28; 365/201

[56] References Cited

U.S. PATENT DOCUMENTS

| | | | |
|---|---|---|---|
| 3,440,715 | 4/1969 | Seng | 324/767 |
| 3,668,523 | 6/1972 | Kuhn | 324/766 |
| 3,795,859 | 3/1974 | Benante et al. | 324/769 |
| 3,889,188 | 6/1975 | Trindade | 324/769 |
| 4,220,918 | 9/1980 | Pepper | 324/765 |
| 4,418,403 | 11/1983 | O'Toole et al. | 371/27 |
| 4,520,448 | 5/1985 | Tremintin | 324/768 |
| 4,631,724 | 12/1986 | Shimizu | 371/27 |
| 4,637,020 | 1/1987 | Schinabeck | 371/25.1 |
| 4,710,704 | 12/1987 | Ando | 371/25.1 |
| 4,719,418 | 1/1988 | Flaker et al. | 324/73.1 |
| 4,755,748 | 7/1988 | Lin | 324/765 |
| 4,808,915 | 2/1989 | Russell | 371/22.6 |
| 4,820,974 | 4/1989 | Katsura et al. | 324/158.1 |
| 4,835,458 | 5/1989 | Kim | 324/754 |
| 4,849,847 | 7/1989 | McIver et al. | 361/88 |
| 4,860,261 | 8/1989 | Kreifels et al. | 371/21.4 |
| 4,977,371 | 12/1990 | Oliver, Jr. et al. | 324/765 |
| 5,047,711 | 9/1991 | Smith et al. | 324/760 |
| 5,057,774 | 10/1991 | Verhelst et al. | 324/537 |
| 5,097,206 | 3/1992 | Perner | 324/73.1 |
| 5,132,615 | 7/1992 | Person | 324/759 |
| 5,138,256 | 8/1992 | Murphy et al. | 324/767 |
| 5,321,354 | 6/1994 | Ooshima et al. | 324/765 |
| 5,392,293 | 2/1995 | Hsue | 324/158.1 |

OTHER PUBLICATIONS

Mao et al., "Total Dose Characterizations of CMOS Devices in Oxygen Implanted Silicon–on Insulator", *IEEE Transactions on Nuclear Science*, vol. NS–33, No. 6, Dec. 1986, pp. 1702–1705.

*Primary Examiner*—Ernest F. Karlsen
*Attorney, Agent, or Firm*—Ira S. Matsil; James C. Kesterson; Richard L. Donaldson

[57] ABSTRACT

A method and system for screening semiconductor circuits is disclosed herein. A circuit 50, such as an SOI circuit, is provided. The circuit includes a plurality of transistors and is coupled to a supply voltage node $V_{DD}$, a reference node $V_{SS}$, and a substrate node $V_{SUB}$. A supply voltage is applied to the supply node while a reference voltage is applied to the reference node and a test voltage is applied to the substrate node. The current $I_{DD}$ flowing to the supply and/or reference node is then measured. These steps are repeated for a plurality of test circuits to determine at least one performance and/or reliability criterion. The steps can then be repeated to screen other circuits by comparing the measured current to the reliability limit(s).

15 Claims, 2 Drawing Sheets

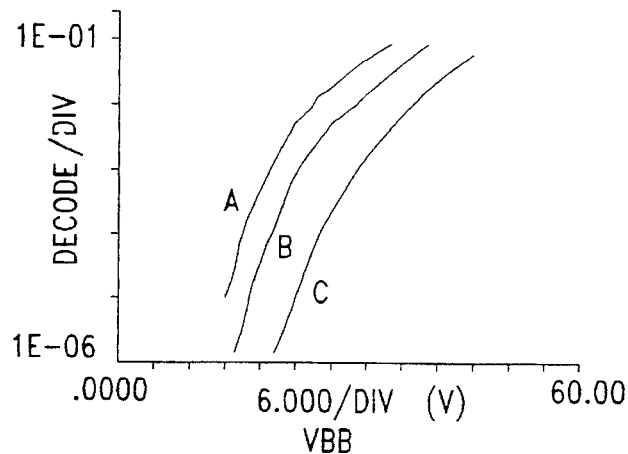
Fig. 4
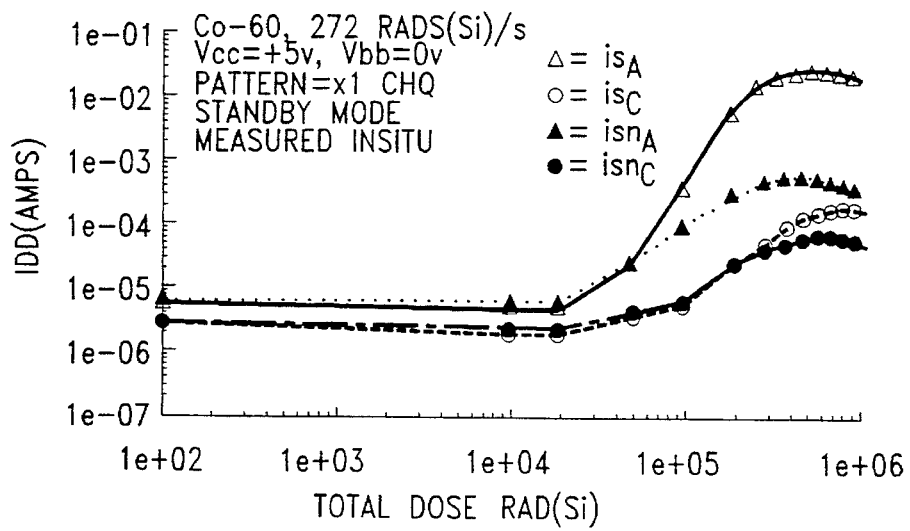
Fig. 5
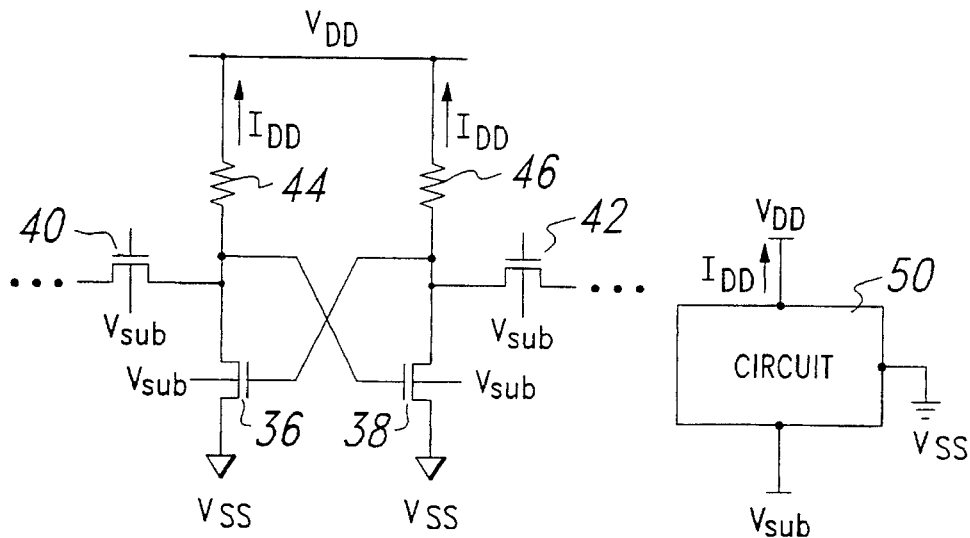
Fig. 6
Fig. 7

METHOD AND SYSTEM FOR SCREENING RELIABILITY OF SEMICONDUCTOR CIRCUITS

This is a division of application Ser. No. 07/909,874, filed Jul. 7, 1992, now U.S. Pat. No. 5,325,054.

FIELD OF THE INVENTION

This invention generally relates to the fabrication of semiconductor devices and specifically to a method and system for screening reliability of semiconductor circuits.

BACKGROUND OF THE INVENTION

To ensure the operability of a memory cell, including storage devices such as registers or latches, each individual device is usually tested after fabrication. The devices are tested by storing a known pattern into the stored cells of the device and subsequently reading the contents of the device. If the data input to the device is not identical to the data output from the device, then the device is discarded as having one or more failed cells. To detect hard failures, where a memory cell is always one or always zero, the device is tested with different patterns, such that each cell is tested for its ability to successfully store both logic states.

Silicon-on-insulator (SOI) technology is becoming of increasing importance in the field of integrated circuits. SOI technology deals with the formation of transistors in a layer of semiconductor material which overlies an insulating layer. A common embodiment of SOI structures is a single crystal layer of silicon which overlies a layer of silicon dioxide.

The structure of an SOI transistor presents a parasitic "back channel" transistor, with the substrate serving as the gate and the insulator film underlying the transistor serving as the gate dielectric. This back channel may provide for a drain-source leakage path along the body node near the interface with the insulator film. A goal in the design of SOI transistor devices is to maximize the back gate threshold voltage so that the possibility of a back channel leakage path is eliminated.

Application of radiation to an SOI transistor device can detrimentally effect the back gate threshold voltage due to charge trapping in the insulator. In many military and space applications, the amount of radiation a circuit can withstand, or the radiation hardness, is specified. This specification must be reliably met for all devices to be utilized in these applications.

SUMMARY OF THE INVENTION

Therefore a need has arisen in the industry for a screening method to determine radiation hardness. Previous screening methods are destructive by nature and therefore can only be performed on a sample of devices. This increases costs since the sample devices must be scrapped and also leads to possible reliability problems if the sample was not truly representative of all the devices being fabricated.

Other objects and advantages will be obvious, and will in part appear hereinafter and will be accomplished by the present invention which provides a method and system for screening reliability of semiconductor circuits.

A method and system for screening semiconductor circuits is disclosed herein. A circuit, such as an SOI circuit, is provided. The circuit includes a plurality of transistors and is coupled to a supply voltage node, a reference node, and a substrate node. A supply voltage is applied to the supply node while a reference voltage is applied to the reference node and a test voltage is applied to the substrate node. The current flowing to the supply node and/or to the reference node is then measured. These steps are repeated for a plurality of test circuits and the characteristic of the measured current is correlated with some reliability characteristic, e.g., total dose hardness or burn-in lifetime, to determine at least one reliability or performance pass/fail criterion. The measurement of the supply and/or reference current as a function of substrate voltage can then be repeated to screen other circuits by comparing the measured current to the performance criterion (criteria).

An advantage of the invention is that the screening method is non-destructive and therefore can be performed on all devices in a production lot. In addition, the method can be performed prior to packaging which eliminates the expense of packaging devices which fail to meet the predetermined criteria.

The present invention can be utilized to test for radiation hardness as well as for other reliability issues. The test can be used with either SOI devices or in another embodiment with bulk devices. The test can be used to test n-channel and/or p-channel transistor devices.

In another aspect of the invention, the ability to classify circuits into various reliability categories for different applications is provided.

BRIEF DESCRIPTION OF THE DRAWINGS

The above features of the present invention will be more clearly understood from consideration of the following descriptions in connection with accompanying drawings in which:

FIG. 4 is a graph illustrating SRAM back gate pre-radiation characteristics;

FIG. 5 is a graph illustrating the radiation hardness for two of the SRAM devices shown in FIG. 4;

FIG. 6 is a schematic drawing of one memory cell in an SRAM array with NMOS memory cells; and FIG. 7 is a general schematic of a circuit to which the present invention may be applied.

Corresponding numerals and symbols in the different figures refer to corresponding parts unless otherwise indicated.

DETAILED DESCRIPTION OF PREFERRED EMBODIMENTS

The making and use of the presently preferred embodiments are discussed below in detail. However, it should be appreciated that the present invention provides many applicable inventive concepts which can be embodied in a wide variety of specific contexts. The specific embodiments discussed are merely illustrative of specific ways to make and use the invention, and do not delimit the scope of the invention.

The following is a description of the apparatus and method of the present invention. A specific application of the present invention, namely testing of radiation hardness in an SOI SRAM (static random access memory), will be described first. The system and method will then be generalized for other circuits and applications.

Radiation induced back gate leakage is a key parameter for total dose hardness of SOI circuits, particularly when zero back gate bias is used. A large variability in the level of radiation at which this back gate leakage becomes significant has been observed, even among circuits from the same wafer. This variability introduces a formidable problem for providing hardness assurance. In one embodiment, a non-destructive approach to screen SOI circuits to predict total dose hardness is presented herein. The understanding from this characterization has led to a modification of the process which now gives more consistent total dose hardness far superior to previous results.

Back gate leakage is generally caused by relatively large radiation induced shifts in the back gate threshold voltage of the n-channel transistors ($V_{TNB}$). An obvious approach to hardening SOI transistors is to have the pre-radiation $V_{TNB}$ sufficiently large so that the back gate will remain off even after the large radiation induced threshold shift. However, because of the distribution of dopants, it is difficult to obtain a sufficiently high $V_{TNB}$ while maintaining the desired front gate threshold voltage $V_{TN}$. If the pre-radiation $V_{TNB}$ is only marginally large enough to prevent inversion with radiation, relatively small process variations could result in softness. In fact, the characteristics of the total dose response of the discrete transistors, illustrated below, is such that a relatively small variation in pre-radiation $V_{TNB}$ could lead to a wide variation in total dose hardness.

From the above it was hypothesized that while discrete transistor characteristics showed total dose hardness, local variations among the thousands of transistors in a 64 K SRAM led to the variability observed in the SRAM hardness. Further, a measurement of the SRAM supply current ($I_{CCq}$) as a function of the substrate voltage ($V_{BB}$) would give an effective $V_{TNB}$ summed over all the transistors in the SRAM, and that this effective $V_{TNB}$ SRAM would be a predictor of the total dose hardness of that SRAM. This hypothesis has been substantiated.

Figure 1:
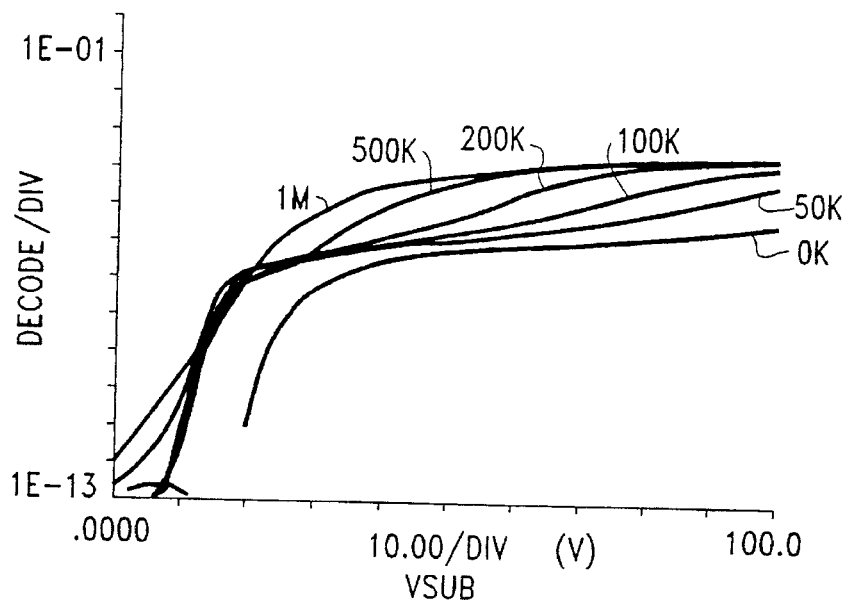
FIG. 1 is a graph illustrating the N-channel back gate characteristics for radiation hardened transistor devices.

The back gate characteristics as a function of total dose of a typical n-channel transistor are illustrated in FIG. 1. The "hump" in the characteristic is likely due to a parasitic edge transistor with a lower back gate threshold voltage (edge $V_{TNB}$) than the main transistor back gate threshold ($V_{TNB}$). This edge $V_{TNB}$ shifts dramatically at relatively low radiation levels, followed by a saturation through 1 Mrad(Si). The transistor is radiation hardened or rad hard (total $V_{TNB}$ greater than zero) through 1 Mrad(Si), but is actually only marginally rad hard (i.e. $V_{TNB}$ is approaching zero) at 50 krad(Si). As a result, relatively small variations in the pre-radiation threshold could cause the total dose hardness level to range from greater than 1 Mrad(Si) to less than 50 krad(Si). Thus, while all the discrete transistors of this type that have been characterized thus far have been rad hard, it is reasonable to expect that local variations among the thousands of transistors in an SRAM may include some softness. Further, measurement of total dose hardness of one circuit on a wafer with a result of hardness greater than one Mrad(Si) may not be sufficient to assure that other circuits on that same wafer will meet standby current specifications even through 100 krad(Si).

The proposed solution to this dilemma in total dose hardness assurance in SOI circuits is to measure the effective back gate threshold of each circuit, and to correlate this effective circuit $V_{TNB}$ with total dose hardness. That is, measure the supply current $I_{CCq}$ as a function of back gate voltage for positive back gate voltages for all the circuits from a given wafer, for example. Then radiate a few circuits selected to cover a range of circuit $V_{TNB}$. Assuming that the results on these selected circuits demonstrate a correlation of total dose hardness with circuit $V_{TNB}$, the circuit $V_{TNB}$ can be used to project the total dose hardness of the associated unradiated circuits. As data is accumulated, the number of circuits radiated to confirm correlation per wafer or per lot could be reduced.

Figure 2A:
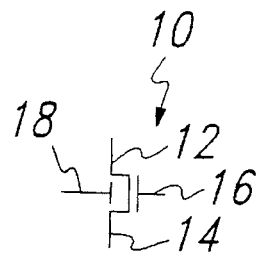
FIG. 2a is a schematic drawing of a field effect transistor and FIG. 2b is a cross-sectional view of an SOI field effect transistor.

Referring now to FIG. 2, the method of the present invention will be described in more detail. FIG. 2a illustrates a schematic of a field effect transistor 10 including a drain 12, a source 14, a gate 16 and a back gate 18.

Figure 2B:
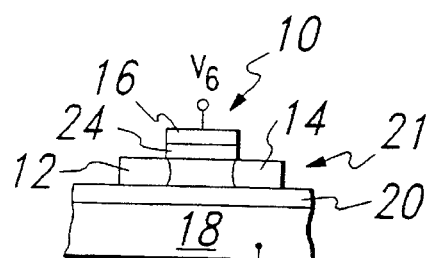

A cross-sectional view of an SOI version of the field effect transistor 10 is illustrated in FIG. 2b. An insulating layer 20 isolates substrate 18 from a top semiconductor layer 21. In a preferred embodiment, the insulating layer 20 comprises silicon dioxide ($SiO_2$) and the substrate 18 comprises monocrystalline silicon. Transistor 10 is formed in semiconductor layer 21 and comprises drain region 12 which is separated from source region 14 by a channel region 22. Gate 16 overlies the channel region 22 and is electrically insulated therefrom by gate dielectric 24.

This invention applies to transistors built on all forms of silicon-on-insulator including, for example, beam recrystallization, epitaxial lateral overgrowth, lateral solid phase epitaxy, and single silicon separation (e.g., SIMOX and FIPOS). Semiconductor materials such as silicon, gallium arsenide, germanium, barium strontium telluride, and mercury cadmium telluride may be used.

To measure the back gate threshold voltage $V_{TB}$ of the transistor 10, a substrate voltage $V_{SUB}$ (or sometimes called $V_{BB}$) is applied to the substrate or back gate 18. For an n-channel device (i.e., drain region 12 and source region 14 are doped with n type impurities such as arsenic, phosphorus or antimony), a positive substrate voltage is applied and the gate voltage $V_G$ is kept low, e.g., at zero volts. The current flowing from the source 12 to the drain 14 is then measured. Ideally, this current would be zero; however, at some threshold voltage $V_{TNB}$ the channel 22 will conduct. Likewise, for a p-channel device (i.e., drain region 12 and source region 14 are doped with p type impurities such as boron), a negative substrate voltage is applied and the front gate voltage $V_G$ is kept high, e.g., at the supply voltage which may be about 5 volts or 3.3 volts or 2.4 volts. Once again, the current flowing from the source 12 to the drain 14 is then measured. For circuits with both n-channel and p-channel devices (e.g., CMOS or BiCMOS circuits), the test may be repeated with both positive and negative substrate voltages.

Figure 3:
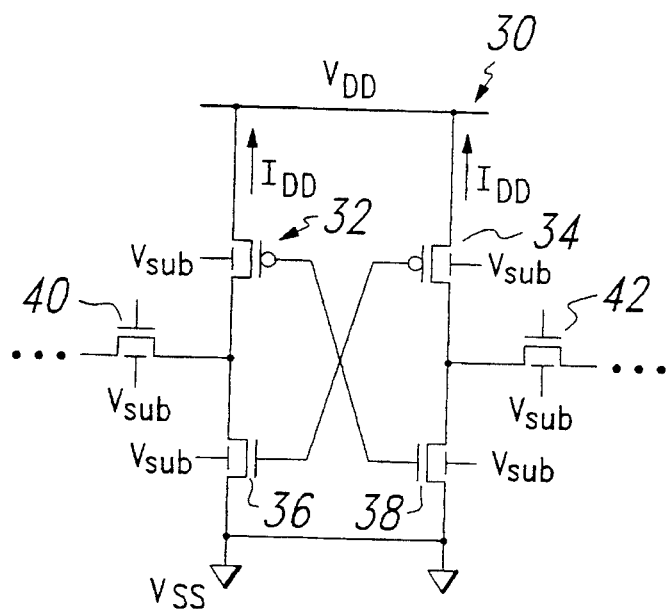
FIG. 3 is a schematic drawing of one memory cell in an SRAM array.

In one aspect of the present invention, the concept discussed with regard to FIG. 2 is expanded to an entire circuit. One example is discussed with reference to FIG. 3 which illustrates one cell 30 in a six transistor SRAM device. In reality, there may be thousands (or in the future millions) of SRAM cells on a single chip.

As is known in the art, the memory cell 30 comprises p-channel transistors 32 and 34 and n-channel transistors 36 and 38 which are configured as cross-coupled CMOS (complementary metal oxide semiconductor) inverters. Transistors 40 and 42, which may be n-channel devices, serve as pass transistors to address the cell for read or write operations. Associated with each transistor is a substrate voltage node $V_{SUB}$ which as illustrated in FIG. 2b may comprise the substrate of an SOI wafer.

During one embodiment of the screening test of the present invention, all the memory cells have a pattern written therein. As an example, the memory cell 30 is written with a logical "0". As is known, when the cell 30 is written with a logical "0" the transistors 32 and 38 are "on" (i.e., conductive), the transistors 34 and 36 are "off" (i.e., non-conductive), and, after addressing is complete, the pass transistors 40 and 42 are "off". Since the supply node $V_{DD}$ is electrically isolated from the reference node $V_{SS}$, no current flows into the supply node or $I_{DD}=0$.

To determine the effective back gate threshold voltage for the n-channel devices $V_{TNB}$ for the SRAM, a positive voltage is applied to the substrate, i.e., $V_{SUB}>0$. (For the p-channel devices, the back gate threshold voltage $V_{TPB}$ can be determined with a negative voltage applied to the substrate, i.e., $V_{SUB}<0$, since positive gate voltages cause p-channel devices to become even less conductive.) Instead of determining an effective $V_{TNB}$ for the circuit, the current to the circuit can be measured at a discrete point(s), and the magnitude of the current measured at that point(s) used to characterize the circuit. For example, the single measurement of the supply current with the substrate voltage at 10 volts can assure that the circuit $V_{TNB}$ is greater than 10 volts. These measured characteristics can then be compared to previously determined points to determine the reliability and/or total dose hardness (or other performance characteristics) of the circuit.

For the SRAM cell, after testing the circuit with one pattern (e.g., all "0"s), the complement of that pattern (e.g., all "1"s) should be written into the memory array and the test repeated. For example, for the cell of FIG. 3, when a "1" is written the transistors 34 and 36 are "on" and the transistors 32 and 38 are "off".

The method and system were experimentally tested. The pre-radiation back gate characteristics of three 64 K SOI SRAMs from the same wafer are given in FIG. 4. Although there is a more gradual transition from "off" to "on" than for individual transistors, the measurement clearly distinguishes the back gate characteristics of these SRAMs. Based on this characterization, the projection was that SRAM 'c' would have excellent total dose hardness (low peak $I_{CCq}$ as a function of total dose), while SRAM 'a' would have relatively poor total dose hardness. This projection was confirmed, as illustrated in FIG. 5. This type of correlation has been confirmed for several 64 K SRAMs from several lots with a wide range of total dose hardness.

This correlation is consistent with the hypothesis that the variability of the SRAM total dose response is due to local variation in transistor edge $V_{TNB}$. With this understanding, it was expected that process modification to block the edge parasitic at the back gate would lead to consistently rad hard SOI circuits. As a result, total dose hardness yield has been improved, and the typical level of hardness is superior to any previously obtained; however, a small percentage of the SRAMs still have poor total dose hardness predictable by the screen.

Although the present invention has been described using patterns of all "1"s and all "0"s thus far, other patterns can be used if desired, such as alternating "0"s and "1"s as one example. In SRAM applications, it is generally desirable that during the test each cell have at least one logical "1" and one logical "0" written to it, such that all transistors will be tested. However, with experience for a given technology, it may be found that measurement for only one pattern is sufficient, in which case it may also be found that writing to the memory is not necessary. That is, any random pattern that occurs on power up could be adequate. This would depend on the distribution of transistor variations for the technology being screened.

Also, it should be noted that while the present invention has been discussed in relation to a CMOS SRAM, many different devices may also be tested using the present invention. In general any transistor device can be used.

For example, one NMOS SRAM cell in a memory array is shown in FIG. 6. The cell illustrated in FIG. 6 is similar to that shown in FIG. 3 with the exception that p-channel transistors 32 and 34 are replaced with resistors 44 and 46. The back gate threshold voltage of the n-channel transistors 36, 38, 40 and 42 (as well as the other transistors in the array and peripheral) can be measured as previously described and correlated to obtain reliability information. It is noted that the load resistors would limit the increase in current with increased substrate voltage; however, a noticeable change in the current $I_{DD}$ flowing into the power supply node should exist.

Further, while the present invention has been described using the measurement of standby current, measurement of active current may be preferred for some applications.

In general, the method and system can be applied to most any circuit. This general case is illustrated in FIG. 7 which shows a general circuit 50. The circuit 50 has a supply voltage node $V_{DD}$, a reference voltage node $V_{SS}$ (which may be ground), and a substrate voltage node $V_{SUB}$. The operation of the circuit is similar to the operation of the specific examples cited hereinbefore. It is noted that in certain circuits there is a current $I_{DD}$ which flows without any back gate bias applied. In these cases, the threshold voltage $V_{TB}$ would be compared to a stand by current instead of a zero current level.

Although described herein with reference to back gate threshold characteristic of SOI devices, the present invention may also be applied to any substrate bias influenced conduction mechanism, e.g., edge leakage. The term circuit back gate threshold voltage ($V_{TB}$) or circuit $V_{TNB}$ is meant to encompass the turning on, or increase from a non-zero level, of all such mechanisms as influenced by the substrate bias, and is not meant to be restrictively interpreted as a threshold voltage in the device physics sense.

The primary application described herein has been to predict radiation hardness. However, in general, the present invention may be applied to other reliability or performance parameters. In a general embodiment, the method would comprise determining the circuit back gate characteristics for a plurality of circuits and then testing these circuits for a selected reliability and/or performance parameter (or parameters). The data can then be correlated to find a threshold point or points. Other devices can then be screened using the points as a criteria.

Correlation can be expected for circuit parameters, such as burn-in lifetime, that would be affected by variation of the back gate characteristics of a transistor in the circuit. The screening can be used to reject circuits that deviate from nominal in a way that would project degraded performance, or to select circuits that deviate from typical in a way that would project superior performance.

This technique has been described in detail for total dose hardness which otherwise requires destructive testing. Correlation with reliability parameters, such as drift during burn-in, is also expected. In extreme cases, back gate leakage can also cause functionality failures. Since this screening test is relatively simple, it can be used in a test sequence, eliminating devices before more lengthy tests are performed, thus reducing total test time. As an example, this screen run at room temperature may predict devices that would fail at elevated temperature.

In addition, the test may be run with an absolute current value(s) as a criterion (criteria), or alternatively, the change in current for different values of substrate voltage may be used.

The test may be repeated with different voltage levels and with a single correlated current criterion, or with a single voltage level with a plurality of current criteria to define different levels of performance. For example, the devices tested may be divided into bins, each bin having an increased reliability and/or performance level. In this case, several criteria points are determined and the devices are compared to these discrete points. The test may also be repeated a number of times with the same voltage for greater accuracy. By repeating the test, the original measurements can be verified.

In the preferred embodiment, the screening test of the present invention is performed prior to packaging and at the wafer level. This provides the advantage of not having to continue fabrication on the devices that do not meet the predetermined criteria. The test, however, may also be performed after the circuit is packaged. In this embodiment, however, there must be access to the substrate such as a dedicated package pin.

In some circuits, the substrate is coupled to the reference node (e.g., ground) with a diode. This connection may be made for ESD (electrostatic discharge) protection. It is preferable that this diode not be coupled during the test since a high voltage on the substrate node relative to the reference node will cause this diode to conduct thereby effectively limiting the voltage which may be attained at the substrate. In one embodiment, the ESD diode may be coupled to the circuit with bond wires or by blowing an anti-fuse after the test is performed. Alternatively, the diode can be disconnected with a fuse after the device is packaged.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of screening semiconductor circuits comprising the steps of:

providing a circuit comprising a plurality of transistors, said circuit coupled to a supply voltage node, a reference node, and a substrate node;

applying a supply voltage to said supply node, a reference voltage to said reference node and a test voltage to said substrate node;

measuring a current flowing to at least one of said supply and reference nodes to determine a characteristic of circuit back gate threshold voltage;

repeating said providing, applying, and measuring steps for a plurality of test circuits to determine at least one pass/fail criterion; and repeating said providing, applying, and measuring steps for a plurality of circuits to be screened, wherein for each of said circuits to be screened said measured current is compared to said at least one pass/fail criterion.

2. The method of claim 1 wherein said pass/fail criterion is determined by performing a performance measurement on each said test circuits and correlating said performance measurement to said measured current.

3. The method of claim 2 wherein said performance measurement comprises a measurement of radiation hardness.

4. The method of claim 1 wherein said circuits comprise silicon-on-insulator circuits.

5. The method of claim 1 wherein said circuits comprise integrated circuits.

6. The method of claim 1 wherein said circuits comprise memory circuits.

7. The method of claim 6 wherein said circuits comprise static random access memory circuits.

8. A method of screening a semiconductor-on-insulator (SOI) circuit for radiation hardness comprising the steps of:

providing an SOI circuit comprising a plurality of transistors formed in a semiconductor layer which overlies a semiconductor substrate and is isolated therefrom, said circuit coupled to a supply voltage node, a reference node, and a substrate node;

applying a supply voltage to said supply node, a reference voltage to said reference node and a test voltage to said substrate node;

measuring a current flowing to at least of said supply and reference nodes to determine a characteristic of circuit back gate threshold voltage;

repeating said providing, applying, and measuring steps for a plurality of test circuits to determine at least one radiation hardness criterion; and repeating said providing, applying, and measuring steps for a plurality of SOI circuits to be screened, wherein for each of said SOI circuits to be screened said measured current is compared to said at least one radiation hardness criterion.

9. The method of claim 8 wherein said at least one radiation hardness criterion is determined by performing a radiation hardness measurement on each said test circuits and correlating said radiation hardness measurement to said measured current.

10. The method of claim 8 wherein said SOI circuits comprise memory circuits.

11. The method of claim 10 wherein said SOI circuits comprise static random access memory circuits.

12. A method of testing a semiconductor integrated circuit comprising the steps of:

providing an integrated circuit formed on a semiconductor substrate, said integrated circuit including active circuitry coupled to a supply voltage node and to a reference voltage node;

applying a first voltage to said supply voltage node;

applying a test voltage to said substrate;

measuring a current flowing from said supply voltage node to said reference voltage node; and comparing said measured current to at least one predetermined current criterion to determine a performance characteristic of said integrated circuit.

13. The method of claim 12 wherein said performance characteristic comprises information on radiation hardness of said circuit.

14. The method of claim 12 wherein said performance characteristic comprises a reliability characteristic of said circuit.

15. The method of claim 12 wherein said circuit comprises a silicon-on-insulator circuit.

* * * * *